United States Patent
Oohira

(10) Patent No.: US 7,965,349 B2
(45) Date of Patent: Jun. 21, 2011

(54) LIQUID CRYSTAL DISPLAY DEVICE HAVING PARTICULAR FLEXIBLE PRINTED SUBSTRATE

(75) Inventor: Eiji Oohira, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 342 days.

(21) Appl. No.: 12/379,218

(22) Filed: Feb. 17, 2009

(65) Prior Publication Data
US 2009/0225253 A1    Sep. 10, 2009

(30) Foreign Application Priority Data

Mar. 7, 2008   (JP) ................. 2008-057332

(51) Int. Cl.
*G02F 1/1333*   (2006.01)
*G02F 1/1335*   (2006.01)
(52) U.S. Cl. ............... 349/58; 349/158; 349/61; 349/65
(58) Field of Classification Search ............ 349/58, 349/158, 61, 65
See application file for complete search history.

(56) References Cited

U.S. PATENT DOCUMENTS

| | | | | |
|---|---|---|---|---|
| 6,411,353 | B1 * | 6/2002 | Yarita et al. | 349/59 |
| 6,515,721 | B2 * | 2/2003 | Jin et al. | 349/58 |
| 7,557,888 | B2 * | 7/2009 | Oohira | 349/149 |
| 2008/0170179 | A1 * | 7/2008 | Shiraishi | 349/65 |

FOREIGN PATENT DOCUMENTS

| JP | 2003-092020 | | 9/2001 |
|---|---|---|---|
| JP | 2003-92020 A | * | 3/2003 |

* cited by examiner

*Primary Examiner* — Mike Qi
(74) *Attorney, Agent, or Firm* — Stites & Harbison PLLC; Juan Carlos A. Marquez, Esq.

(57) ABSTRACT

A liquid crystal display device includes: a liquid crystal display panel where a semiconductor chip driving pixel circuits is mounted on a main surface of a first substrate which is exposed by recession of a second substrate, wire terminals connect to the semiconductor chip; a backlight illuminating a back surface of the liquid crystal display panel with illumination light; a mold frame housing the liquid crystal display panel and the backlight; and a reflection sheet disposed on a back surface of the mold frame. The liquid crystal display device includes an FPC having one end portion connected to wire terminals on the main surface of the first substrate, and another end portion on which LEDs are mounted, the mold frame includes a housing portion for a light guide plate which has a light-exiting surface including a display region of the liquid crystal display panel and housing portions for the LEDs. When the FPC is folded around to the back surface side of the backlight and the LEDs mounted on the other end portion of the FPC are housed in the housing portions for the LEDs of the mold frame, an end surface of the other end portion of the FPC is disposed to face, in the same plane, an end surface of the reflection sheet.

3 Claims, 5 Drawing Sheets

LIQUID CRYSTAL DISPLAY DEVICE HAVING PARTICULAR FLEXIBLE PRINTED SUBSTRATE

CROSS-REFERENCE TO RELATED APPLICATION

The disclosure of Japanese Patent Application No. 2008-57332 filed on Mar. 7, 2008 including the specification, drawings and abstract is incorporated herein by reference in its entirety.

BACKGROUND OF THE INVENTION

1. Field of the Invention

The present invention pertains to a liquid crystal display device and particularly relates to a liquid crystal display device whose entirety is thinned by a novel folding structure of a wire material toward a back surface of a backlight.

2. Description of the Related Art

Image display devices that use a non-self-luminous liquid crystal display panel visualize, with illumination light from external illumination means, an electronic latent image that has been formed on the liquid crystal display panel. In the external illumination means, an illumination device is installed on the back surface or the front surface of the liquid crystal display panel, excluding a structure that utilizes natural light. Particularly in structures where high brightness is required, a structure where the illumination device is disposed on the back surface of the liquid crystal display panel is becoming mainstream. This is called a backlight.

In compact and lightweight liquid crystal display devices such as mobile telephones, further thinning is demanded. In backlights of this type of liquid crystal display device, a side edge backlight that uses a light guide plate and white light-emitting diodes (LEDs) is becoming mainstream. The backlight configured by the light guide plate and the liquid crystal display panel are superposed and fitted into a frame-like member called a mold to form a liquid crystal display module, the white light-emitting diodes (LEDs) are mounted on part of a flexible printed substrate (FPC) that is a wire material for supplying display signals and drive voltages from a host (display signal source), and this mounting site is folded so as to be disposed in an LED housing space disposed in the mold. Examples of publications that disclose this type of related art include Japanese Patent Application Laid-Open Publication No. 2003-92020 (patent document 1).

SUMMARY OF THE INVENTION

In a compact liquid crystal display device such as a mobile telephone, there is used a structure where the LEDs are mounted in a region of part of the FPC and just that mounting part is routed around to the back surface of the liquid crystal display module and serves as a light source of the backlight. In a conventional structure, sometimes the LED mounting part of the FPC ends up becoming superposed on a reflection sheet of the backlight, and this slight superposed portion interferes with a mounting device (for a mobile telephone, etc.); this is handled by disposing a clearance in order to avoid this interference, which has hindered thinning of the liquid crystal display device and the entire mobile telephone.

It is an object of the present invention to provide a liquid crystal display device whose entirety is thinned by improving the folding structure of a wire material toward a back surface of a backlight.

A liquid crystal display device of the present invention comprises: a liquid crystal display panel that includes a first substrate having a main surface on which is formed a display region in which numerous pixel circuits are arrayed in a matrix, a second substrate having one side that recedes from a corresponding side of the first substrate, and a liquid crystal layer that is sealed between the first substrate and the second substrate, with a semiconductor chip that drives the pixel circuits being mounted on the main surface of the first substrate which is exposed by the recession of the second substrate, and wire terminals that connect to the semiconductor chip; a backlight that illuminates a back surface of the liquid crystal display panel with illumination light; a mold frame that houses the liquid crystal display panel and the backlight; and a reflection sheet that is disposed on a back surface of the mold frame.

Additionally, the liquid crystal display device includes an FPC having one end portion connected to the wire terminals on the main surface of the first substrate and another end portion on which LEDs are mounted, wherein the mold frame includes a housing portion for a light guide plate that has a light-exiting surface including the display region of the liquid crystal display panel and housing portions for the LEDs, and wherein when the FPC is folded around to the back surface side of the backlight and the LEDs mounted on the other end portion of the FPC are housed in the housing portions for the LEDs of the mold frame, an end surface of the other end portion of the FPC faces, in the same plane, an end surface of the reflection sheet.

The end surface of the other end portion of the FPC is disposed so as to face the end surface of the reflection sheet in the same plane. Therefore, the LED mounting part of the FPC is not superposed on the reflection sheet of the backlight, and it becomes unnecessary to dispose a clearance for avoiding a situation where the superposed portion interferes with the mounting device (for a mobile telephone, etc.). As a result, thinning of the liquid crystal display device and the entire mobile telephone can be realized.

DETAILED DESCRIPTION OF THE INVENTION

Below, the best mode for implementing the present invention will be described in detail with reference to the drawings, beginning with the related art and then leading to an embodiment of the present invention.

Figure 1:
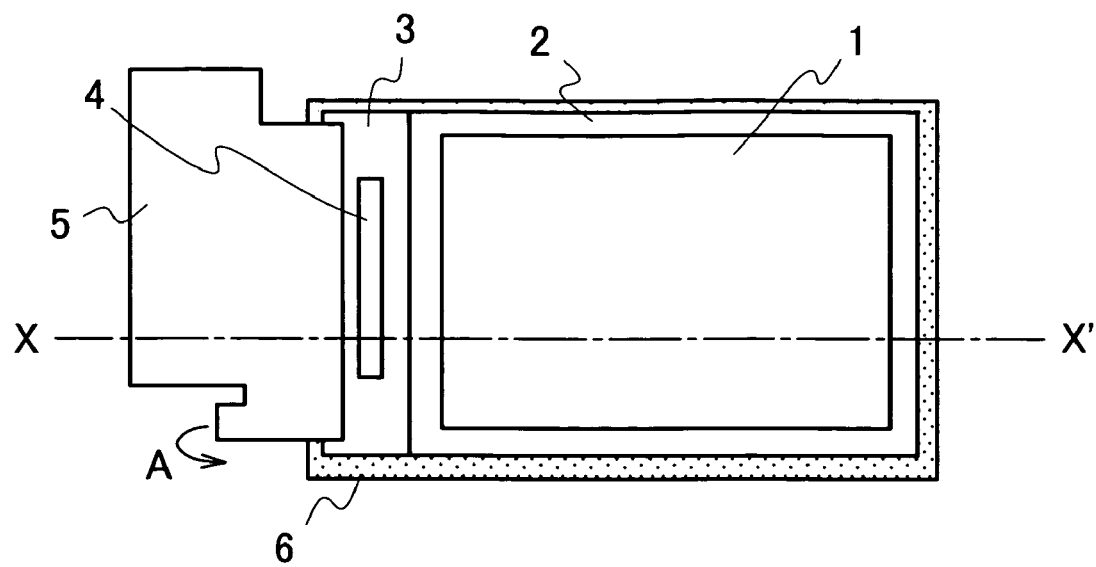
FIG. 1 is a plan diagram of a liquid crystal display panel side of a liquid crystal display module for a mobile telephone that is one example of a mounting device to which the present invention is applied.
Figure 2:
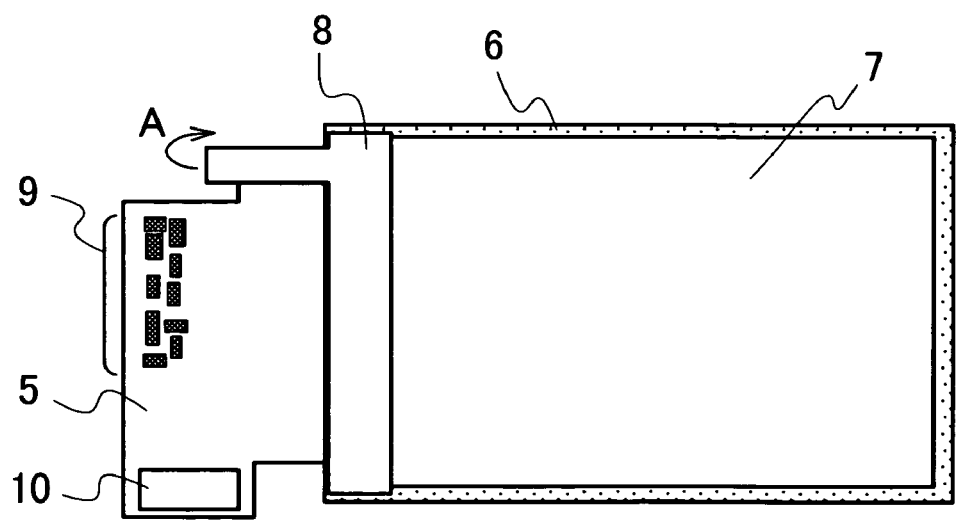
FIG. 2 is a plan diagram of a back surface, that is, a backlight side, of FIG. 1.

FIG. 1 is a plan diagram of a liquid crystal display panel side of a liquid crystal display module for a mobile telephone that is one example of a mounting device to which the present invention is applied. FIG. 2 is a plan diagram of a back surface, that is, a backlight side, of FIG. 1. Turning now to FIG. 1 and FIG. 2, a liquid crystal display panel including a first substrate 3 and a second substrate 2 that configure a liquid crystal display module, and a backlight (not shown) disposed on a back surface of the liquid crystal display panel, are housed in a mold frame 6 preferably made of a resin material. Polarization plates 1 and 14 are adhered to surfaces of the first substrate 3 and the second substrate 2, respectively.

The first substrate 3 and the second substrate 2 of the liquid crystal display panel are both glass plates, and liquid crystal is sealed between main surfaces of both substrates 3 and 2 and in a display region. Numerous pixel circuits configured by thin-film transistors are arrayed in a matrix in the display region of the main surface of the first substrate 3. Further, numerous color filters are formed, in correspondence to pixels, in the display region of the main surface of the second substrate 2. Alternatively, the color filters may be formed on the first substrate 3.

One side of the second substrate 2 recedes from the corresponding one side of the first substrate 3 so as to expose part of the main surface of the first substrate 3. Wire terminals extending from the pixel circuits are disposed on the exposed part of the main surface of the first substrate 3, and a semiconductor chip 4 that is a drive circuit supplying display signals to the pixel circuits is mounted on the wire terminals.

Further, input terminals of the semiconductor chip 4 are disposed on the exposed end portion of the main surface of the first substrate 3, and one end portion of a flexible printed substrate (FPC) 5 is connected to the input terminals. Part of the FPC 5 is folded around to the back surface side of the backlight as indicated by arrow A so as to cause a white light-emitting diode (LED) attachment part 8 mounted on the other end portion of the FPC 5 to face LED housing portions 13 disposed in the later-described mold frame 6. Electronic parts 9 such as resistors and capacitors and a connector 10 for connecting to a printed substrate of an unillustrated host are attached to the FPC 5.

Figure 3:
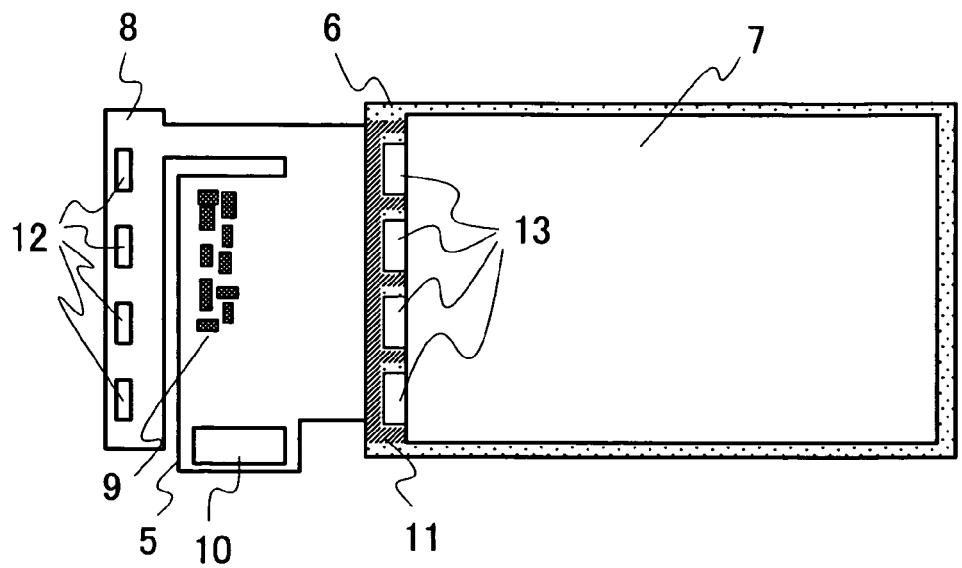
FIG. 3 is a plan diagram showing a state where the other end portion of an FPC including an LED attachment part shown in FIG. 2 has been opened.

FIG. 3 is a plan diagram showing a state where the other end portion of the FPC 5 including the LED attachment part 8 shown in FIG. 2 has been opened. In this configuration, four LEDs 12 are mounted on the LED attachment part 8. The four LEDs 12 are inserted into the LED housing portions 13 disposed in the mold frame 6 and are mounted in predetermined positions. It will be noted that the LED attachment part 8 is adhered to the mold frame 6 by double-sided tape 11.

Figure 4:
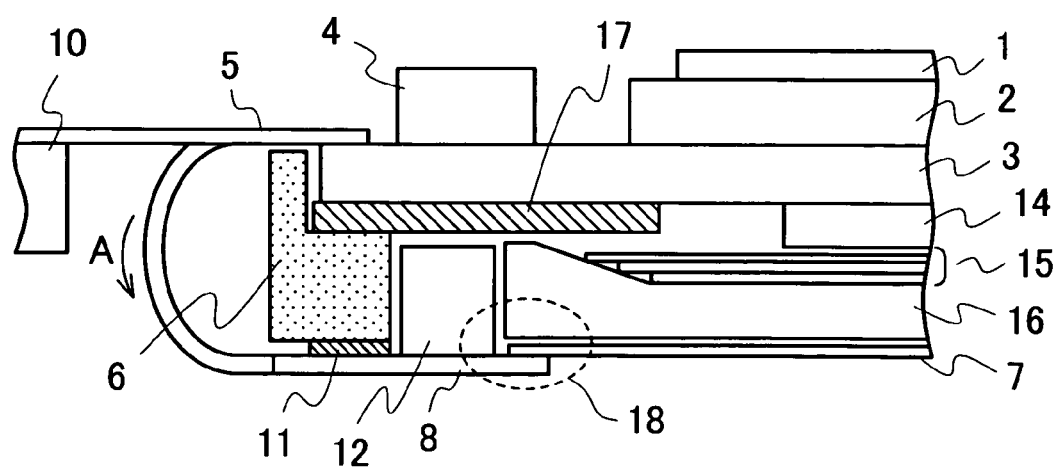
FIG. 4 is a cross-sectional diagram of relevant portions along line X-X' of FIG. 1 and shows a state where the other end portion of the FPC including the LED attachment part has been folded around to the back surface of the backlight.

FIG. 4 is a cross-sectional diagram of relevant portions along line X-X' of FIG. 1 and shows a state where the other end portion of the FPC 5 including the LED attachment part 8 has been folded around to the back surface of the backlight.

Turning now to FIG. 4, reference numerals that are the same as those in FIG. 1 to FIG. 3 correspond to the same functional portions. The liquid crystal display panel, which is configured by the first substrate 3, the second substrate 2 and the polarization plates 1 and 14, and the backlight, which is configured by a light guide plate 16, the LEDs 12 and a reflection sheet 7, are housed in the mold frame 6. An optical compensation sheet 15 including a laminate of a diffusion plate and a prism plate is interposed between the liquid crystal display panel and the light guide plate 16.

The back surface of the end portion of the first substrate 3 of the liquid crystal display panel is adhered to the mold frame 6 by double-sided tape 17, and the LED attachment part 8 is adhered to the mold frame 6 by the double-sided tape 11. In this configuration, the distal end portion of the LED attachment part 8 of the FPC 5 is superposed on the end portion of the reflection sheet 7. The reflection sheet 7 is disposed so as to evenly cover the undersurface of the light guide plate 16. This superposition becomes an obstacle to reducing the thickness of the liquid crystal display module. This superposition has resulted from the conventional structure of the LEDs 12. Below, the conventional structure will be described with reference to FIG. 5.

Figure 5:
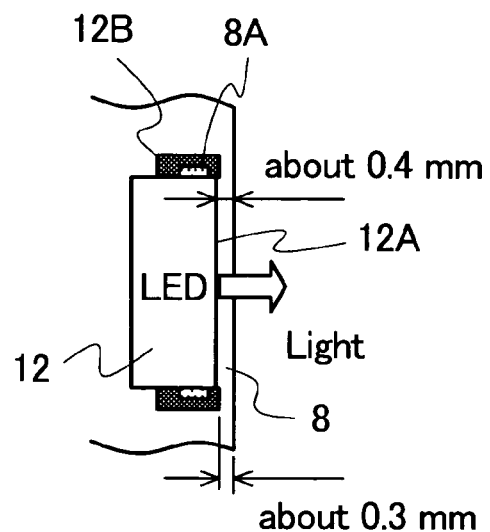
FIG. 5 is a plan diagram of relevant portions describing a conventional structure of LEDs that are mounted on the other end portion of the FPC.

FIG. 5 is a plan diagram of relevant portions describing the conventional structure of the LEDs 12 mounted on the other end portion of the FPC 5. Terminals 12B of the LEDs 12 are fixed by soldering to solder pads 8A in wire portions formed on the LED attachment part 8 of the FPC 5. The conventional LEDs 12 are disposed in positions where their terminals 12B are close to their light-exiting surfaces 12A. When the terminals 12B are soldered to the solder pads 8A, expansion of the solder must be taken into consideration. For that reason, the LEDs 12 must be in positions receded from the distal end of the LED attachment part 8 of the FPC 5. As a result, as indicated by reference numeral 18 in FIG. 4, the distal end of the LED attachment part 8 must be superposed on the reflection sheet 7. Examples of dimensions are shown in FIG. 5.

In view of the circumstances of the related art described above, the present invention is given a configuration described in the following embodiment.

Embodiment

Figure 6:
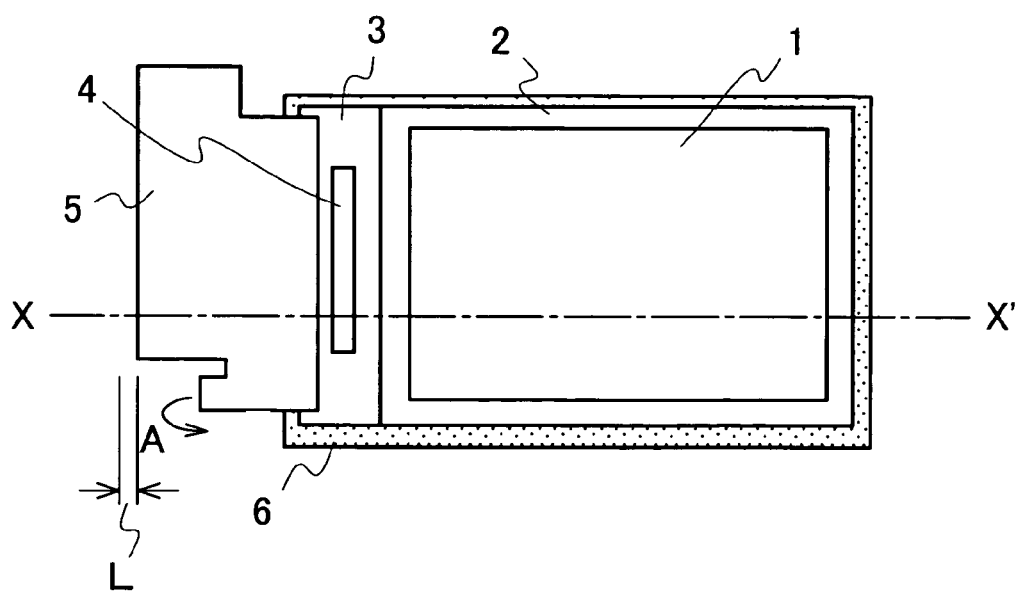
FIG. 6 is a plan diagram of a liquid crystal display panel side of a liquid crystal display module for a mobile telephone that is one example of a mounting device describing an embodiment of the present invention.
Figure 7:
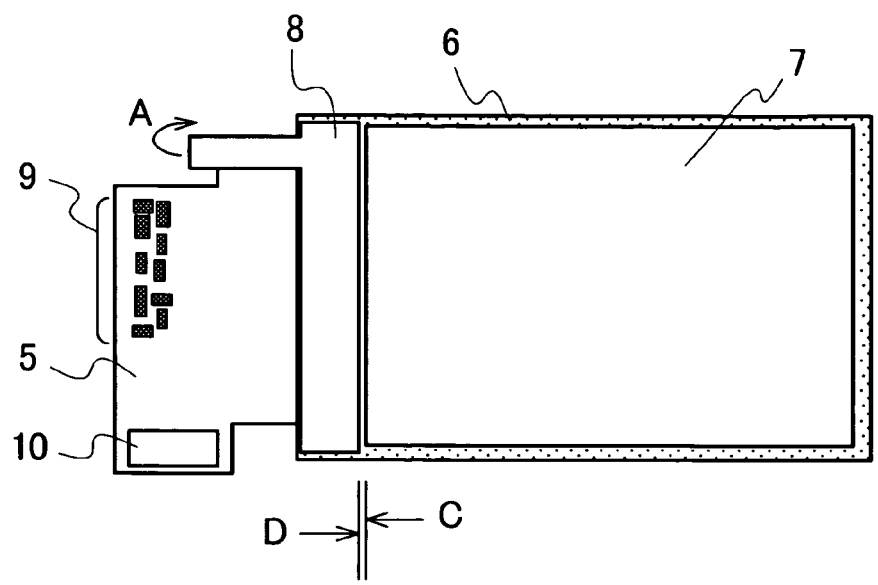
FIG. 7 is a plan diagram of a back surface, that is, a backlight side, of FIG. 6.

FIG. 6 is a plan diagram of a liquid crystal display panel side of a liquid crystal display module for a mobile telephone that is one example of a mounting device describing the embodiment of the present invention. FIG. 7 is a plan diagram of a back surface, that is, a backlight side, of FIG. 6. Turning now to FIG. 6 and FIG. 7, a liquid crystal display panel including a first substrate 3 and a second substrate 2 that configure a liquid crystal display module, and a backlight (not shown), which is disposed on a back surface of the liquid crystal display panel, are housed in a mold frame 6 preferably made of a resin material. Polarization plates 1 and 14 are adhered to surfaces of the first substrate 3 and the second substrate 2. This configuration is different from the configuration shown in FIG. 1 and FIG. 2 in that the other end of a flexible printed substrate (FPC) 5 is shorter by L.

The first substrate 3 and the second substrate 2 of the liquid crystal display panel are both glass plates, and liquid crystal is sealed between main surfaces of both substrates and in a display region. Numerous pixel circuits configured by thin-film transistors are arrayed in a matrix in the display region of the main surface of the first substrate 3. Further, numerous color filters are formed, in correspondence to pixels, in the display region of the main surface of the second substrate 2. Alternatively, color filters may be formed on the first substrate 3.

One side of the second substrate 2 recedes from the corresponding one side of the first substrate 3 so as to expose part of the main surface of the first substrate 3. Wire terminals extending from the pixel circuits are disposed on the exposed part of the main surface of the first substrate 3, and a semiconductor chip 4 that is a drive circuit supplying display signals to the pixel circuits is mounted on the wire terminals.

Further, input terminals of the semiconductor chip 4 are disposed on the exposed end portion of the main surface of the first substrate 3, and one end portion of the FPC 5 is connected to the input terminals. Part of the FPC 5 is folded around to the back surface side of the backlight as indicated by arrow A so as to cause a white light-emitting diode (LED) attachment part 8 mounted on the other end portion of the FPC 5 to face LED housing portions 13 disposed in the later-described mold frame 6. Electronic parts 9 such as resistors and capacitors and a connector 10 for connecting to a printed substrate of an unillustrated host are attached to the FPC 5. As shown in FIG. 7, arrow C represents a distal end, on an LED side, of a reflection sheet 7 and arrow D represents the distal end of the LED attachment part 8, and the LED attachment part 8 is disposed such that its distal end faces the distal end, on the LED side, of the reflection sheet 7 with a minute clearance therebetween or abuts against the distal end, on the LED side, of the reflection sheet 7.

Figure 8:
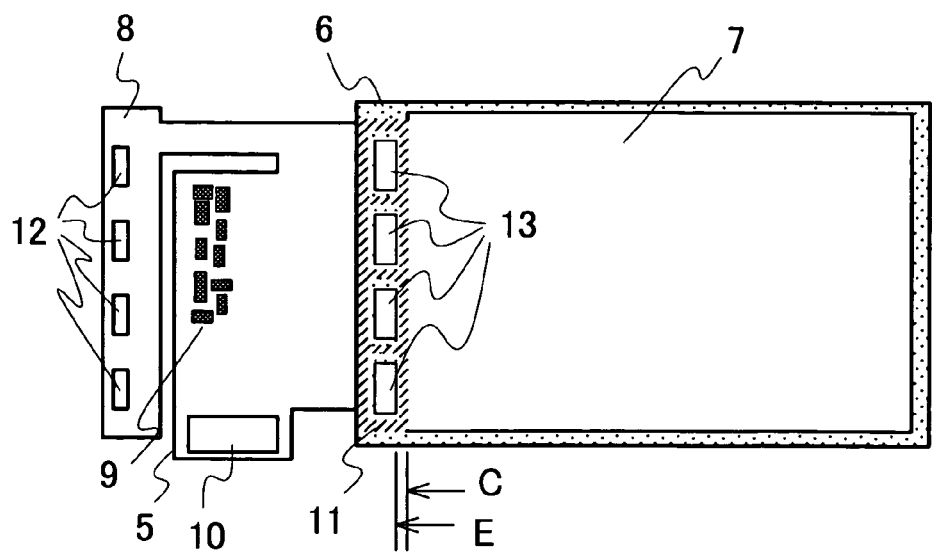
FIG. 8 is a plan diagram showing a state where the other end portion of an FPC including an LED attachment part shown in FIG. 7 has been opened.

FIG. 8 is a plan diagram showing a state where the other end portion of the FPC 5 including the LED attachment part 8 shown in FIG. 7 has been opened. In this configuration, four LEDs 12 are mounted on the LED attachment part 8. The four LEDs 12 are inserted into the LED housing portions 13 disposed in the mold frame 6 and are mounted in predetermined positions. It will be noted that the LED attachment part 8 is adhered to the mold frame 6 by double-sided tape 11. Arrow C represents the distal end, on the LED side, of the reflection sheet 7 of the present embodiment, and arrow E represents the distal end, on the LED side, of the conventional reflection sheet 7.

Figure 9:
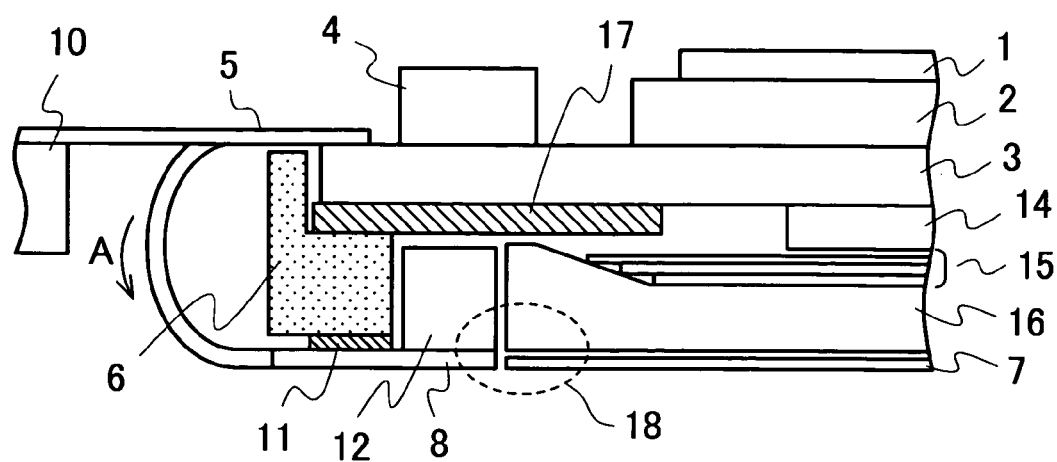
FIG. 9 is a cross-sectional diagram of relevant portions along line X-X' of FIG. 6 and shows a state where the other end portion of the FPC including the LED attachment part has been folded around to the back surface of the backlight.

FIG. 9 is a cross-sectional diagram of relevant portions along line X-X' of FIG. 6 and shows a state where the other end portion of the FPC 5 including the LED attachment part 8 has been folded around to the back surface of the backlight. Turning now to FIG. 9, reference numerals that are the same as those in FIG. 6 to FIG. 8 correspond to the same functional portions. The liquid crystal display panel configured by the first substrate 3, the second substrate 2 and the polarization plates 1 and 14, and the backlight configured by a light guide plate 16, the LEDs 12 and the reflection sheet 7, are housed in the mold frame 6. An optical compensation sheet 15 including a laminate of a diffusion plate and a prism plate is interposed between the liquid crystal display panel and the light guide plate 16.

The back surface of the end portion of the first substrate 3 of the liquid crystal display panel is adhered to the mold frame 6 by double-sided tape 17, and the LED attachment part 8 is adhered to the mold frame 6 by the double-sided tape 11. In this configuration, the distal end portion of the LED attachment part 8 of the FPC 5 faces, with a minute clearance therebetween, or abuts against the end portion of the reflection sheet 7 in the same plane. The reflection sheet 7 is disposed so as to evenly cover the undersurface of the light guide plate 16. Thus, an increase in the thickness of the liquid crystal display module is avoided. This avoidance of superposition results from a novel structure of the LEDs 12. Below, the novel structure will be described using FIG. 10.

Figure 10:
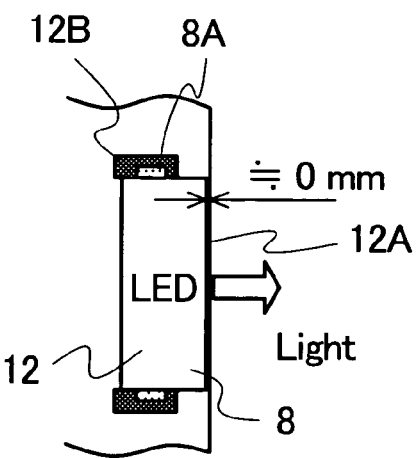
FIG. 10 is a plan diagram of relevant portions describing a novel structure of LEDs that are mounted on the other end portion of the FPC.

FIG. 10 is a plan diagram of relevant portions describing the novel structure of the LEDs 12 mounted on the other end portion of the FPC 5. Terminals 12B of the LEDs 12 are fixed by soldering to solder pads 8A in wire portions formed on the LED attachment part 8 of the FPC 5. The terminals 12B of the LEDs 12 are disposed in positions away from light-exiting surfaces 12A. Even when expansion of the solder when the terminals 12B are soldered to the solder pads 8A is taken into consideration, there is no problem when the terminals 12B are disposed in these positions. For that reason, the LEDs 12 can be disposed in positions that coincide with, or substantially coincide with, the distal end of the LED attachment part 8 of the FPC 5. As a result, as indicated by reference numeral 18 in FIG. 9, a configuration where the distal end of the LED attachment part 8 is superposed on the reflection sheet 7 can be avoided. Examples of dimensions are shown in FIG. 10.

What is claimed is:

1. A liquid crystal display device comprising:
a liquid crystal display panel including
a first substrate having a main surface on which is formed a display region in which numeral pixel circuits are arrayed in a matrix,
a second substrate having one side that recedes from a corresponding side of the first substrate, and
a liquid crystal layer that is sealed between the first substrate and the second substrate,
with a semiconductor chip that drives the pixel circuits being mounted on the main surface of the first substrate which is exposed by the recession of the second substrate, and wire terminals that connect to the semiconductor chip;
a backlight that illuminates a back surface of the liquid crystal display panel with illumination light;
a mold frame that houses the liquid crystal display panel and the backlight; and
a reflection sheet disposed on a back surface of the mold frame,
wherein the liquid crystal display device includes a flexible printed substrate having one end portion connected to the wire terminals on the main surface of the first substrate and another end portion on which light-emitting diodes are mounted,
wherein the mold frame includes a housing portion for a light guide plate which has a light-exiting surface including the display region of the liquid crystal display panel and housing portions for the light-emitting diodes, and
wherein when the flexible printed substrate is folded around to the back surface side of the backlight and the light-emitting diodes mounted on the other end portion of the flexible printed substrate are housed in the housing portions for the light-emitting diodes of the mold frame, an end surface of the other end portion of the flexible printed substrate faces, in the same plane, an end surface of the reflection sheet.

2. The liquid crystal display device of claim 1, wherein the end surface of the other end portion of the flexible printed substrate and light-exiting surfaces of the light-emitting diodes substantially coincide with each other.

3. The liquid crystal display device of claim 1, wherein an optical compensation sheet having a laminate of a diffusion plate and a prism plate is disposed between the light guide plate that configures the backlight and the liquid crystal display panel.

* * * * *